United States Patent [19]

Okudaira et al.

[11] Patent Number: 5,157,469
[45] Date of Patent: Oct. 20, 1992

[54] FIELD EFFECT TRANSISTOR HAVING A MULTILAYER INTERCONNECTION LAYER THEREIN WITH TAPERED SIDEWALL INSULATORS

[75] Inventors: Tomonori Okudaira; Hideaki Arima; Makoto Ohi; Kaoru Motonami; Yasushi Matsui, all of Hyogo, Japan

[73] Assignee: Mitsubishi Denki Kabushiki Kaisha, Tokyo, Japan

[21] Appl. No.: 685,398

[22] Filed: Apr. 16, 1991

[30] Foreign Application Priority Data

May 1, 1990 [JP] Japan .................. 2-115641

[51] Int. Cl.$^5$ .............. H01L 29/68; H01L 29/06; H01L 29/34; H01L 23/48
[52] U.S. Cl. ................. 357/23.6; 357/239; 357/54; 357/71
[58] Field of Search .......... 357/23.6, 23.5, 23.9, 357/54, 71; 437/981

[56] References Cited

U.S. PATENT DOCUMENTS 4,970,564  11/1990  Kimura et al. .............. 347/23.6

FOREIGN PATENT DOCUMENTS 1-257364  10/1989  Japan .
2-40949   2/1990   Japan .

OTHER PUBLICATIONS

Watanabe et al., "Stacked Capacitor Cells for High-Density Dynmic RAMs," *IEEE* 1988, pp. 600–603.
Kimura et al., "An Optically Delineated 4.2 $\mu m^2$ Self-Aligned Isolated-Plate Stacked-Capacitor DRAM Cell," *IEEE Transactions on Electron Devices*, vol. 35, No. 10 (Oct. 1988), pp. 1591–1594.
Koyanagi et al., "Novel High Density, Stacked Capacitor MOS RAM," *IEEE* (1978), pp. 348–351.

*Primary Examiner*—William Mintel
*Assistant Examiner*—Robert Limanek
*Attorney, Agent, or Firm*—Lowe, Price, LeBlanc & Becker

[57] ABSTRACT

A field effect transistor and a method of manufacturing thereof are disclosed that is not reduced in the characteristic of withstanding voltage between multilayer interconnection layers even when scaled to a higher integration. This field effect transistor includes side walls 21a formed on both sides of a bit line 15 so that the bottom side end contacts the upper surface of side walls 20a of gate electrodes 4b and 4c. The thickness of an insulating film interposed between gate electrodes 4b and 4c and a base portion 11a forming a low electrode 11 of a capacitor is not reduced. The characteristic of withstanding voltage is not deteriorated between multilayer interconnection layers even when scaled to higher integration.

15 Claims, 8 Drawing Sheets

FIELD EFFECT TRANSISTOR HAVING A MULTILAYER INTERCONNECTION LAYER THEREIN WITH TAPERED SIDEWALL INSULATORS

BACKGROUND OF THE INVENTION

1. Field of the Invention

The present invention relates generally to a field effect transistor, and more particularly, to a field effect transistor applied to a DRAM, and a method of manufacturing thereof.

2. Description of the Background Art

In recent years, the demand for semiconductor memory devices is rapidly increasing due to the remarkable spread of information processing apparatus such as computers. Semiconductor memory devices having functionally large scale storage capacity and capable of high speed operation are required. Accordingly, developments in techniques are carried out regarding high density integration, quick response, and high reliability of semiconductor memory devices.

A DRAM is well known as a semiconductor memory device being capable of random input/output of storage information. A DRAM usually comprises a memory cell array including a storage region for storing a plurality of storage information, and a peripheral circuit required for input from and output to an external source. FIG. 6 is a block diagram showing a structure of a conventional DRAM. Referring to FIG. 6, a DRAM 50 comprises a memory cell array 51 for storing data signal of storage information, a row-and-column address buffer 52 for receiving external address signals to select memory cells each forming a unit storage circuit, a row decoder 53 and a column decoder 54 for specifying a memory cell by decoding the address signal, a sense refresh amplifier 55 for amplifying and reading out the signal stored in the specified memory cell, a data-in buffer 56 and a data-out buffer 57 for data input/output, and a clock generator 58 for generating a clock signal.

The memory cell array 51 occupying a large area on the semiconductor chip has a plurality of memory cells arranged in a matrix manner and each for storing unit storage information. A memory cell is generally constituted by one MOS transistor and one capacitor connected thereto. This memory cell is well known as an one-transistor one-capacitor type memory cell. Such memory cells are widely used for large capacity DRAMs because of its simple structure contributing to the improvement in higher integration density of the memory cell array.

FIG. 7 is a sectional view of a memory cell of a conventional DRAM. Referring to FIG. 7, source/drain regions 6 are formed with a predetermined distance therebetween on a P type silicon substrate 1. Gate electrodes 4b and 4c are formed between the pair of source/drain regions 6 with a gate insulating film 5 thereunder. An insulating oxide film 200 is formed to cover gate electrodes 4b and 4c, with side walls 200a and 200b formed at the side walls thereof. A bit line 150 is connected to one of source/drain regions 6 formed between gate electrodes 4b and 4c. An insulating oxide film 210 and side walls 210a and 210b are formed over and at the side walls of bit line 150. A base portion 11a forming a lower electrode of a capacitor storing charge is connected to the other of source/drain regions 6. Base portion 11a and gate electrode 4b are insulated by side wall 200a and insulating oxide film 200. More specifically, the bottom of side wall 210a formed at the side wall of bit line 150 is located over gate electrode 4b. Insulating oxide film 200 becomes lower in height at one end of the region connecting side wall 210a and insulating oxide film 200. This is due to a manufacturing process that will be described later. In a conventional memory cell, insulating oxide film 200 over gate electrode 4b has a thick portion and a thin portion with a step at the boundary region.

FIGS. 8A–8D are sectional views of the memory cell of the conventional DRAM of FIG. 7. The manufacturing process will be described with reference to FIGS. 7–8D. Referring to FIG. 8A, gate electrodes 4b and 4c are spaced apart on P type silicon substrate 1 with gate insulating film 5 thereunder. Insulating oxide film 200 is formed to cover gate electrodes 4b and 4c. Source/drain regions 6 are formed, followed by forming side walls 200a and 200b to cover the side walls of gate electrodes 4b and 4c, and insulating oxide film 200. Referring to FIG. 8B, bit line 150 is formed to connect one of source/drain regions 6 on P type silicon substrate 1 between gate electrodes 4b and 4c. Side wall 200b and insulating oxide film 200 are interposed between gate electrodes 4b, 4c and bit line 150 to establish withstanding voltage. An insulating oxide film 210 is formed on bit line 150. Referring to FIG. 8C, an oxide film 30 is formed on the whole surface. Referring to FIG. 8D, oxide film 30 is etched anisotropically to form side walls 210a. In forming side walls 210a, a portion of insulating oxide film 200 formed on gate electrodes 4b and 4c is over-etched. This over-etching results in a disadvantage that the thickness of a portion of insulating oxide film 200 is reduced. When base portion 11a connected to source drain region 6 is formed to contact side wall 200a, insulating oxide film 200, side wall 210a and insulating oxide film 210 in the above described state, insulating oxide film 200 interposed between base portion 11a and gate electrode 4b becomes thinner at the portion where oxide film 200 on gate electrode 4b is over-etched. When a portion of insulating oxide film 200 is over-etched to become thinner at that portion due to over-etching in forming side wall 210a, an edge portion is formed at the boundary of the thinner portion and the remaining portion of insulating oxide film 200.

As mentioned above, a memory cell of a conventional DRAM has insulating oxide film 200 on gate electrode 4b over-etched in forming side wall 210a for establishing withstanding voltage between base line 150 and base portion 11a constituting the lower electrode of the capacitor. This will result in a configuration where the thickness of insulating oxide film 200 becomes thinner in the over-etched portion, with an edge portion formed at the boundary of the thick and thin film. This posed a problem that withstanding voltage characteristic between base portion 11a and gate electrode 4b is deteriorated. There was another problem that field concentration occurs at the above-mentioned edge portion.

Conventional semiconductor devices with a multilayer wiring structure scaled to higher densities had a problem that the thickness of the insulating layer interposed between multilayer interconnection layers becomes thin to make it difficult to improve withstanding voltage.

SUMMARY OF THE INVENTION

An object of the present invention is to prevent the characteristic of withstanding voltage between multilayer interconnection layers from deteriorating even when a field effect transistor is scaled to higher density.

Another object of the present invention is to improve the characteristic of withstanding voltage between a gate electrode and a lower electrode of a capacitor in a field effect transistor.

A further object of the present invention is to prevent occurrence of local field concentration between a gate electrode and a lower electrode of a capacitor in a field effect transistor.

A still further object of the present invention is to prevent reduction in film thickness of an insulating film between multilayer interconnection layers even when scaled to higher densities in a method of manufacturing a field effect transistor.

Yet another object of the present invention is to prevent an insulating film on a gate electrode from being over-etched in forming side walls of a conductive layer above a gate electrode in a method of manufacturing a field effect transistor.

According to an aspect of the present invention, a field effect transistor includes a semiconductor substrate, a pair of impurity regions, a gate electrode, a first insulating layer, a conductive layer, and a second insulating layer. The pair of impurity regions is formed on the surface of the semiconductor substrate. The gate electrode is formed between the pair of impurity regions on the surface of the semiconductor substrate with a gate insulating film thereunder. The first insulating film includes a first upper oxide film formed on the gate electrode, and a pair of first side wall insulating films formed on both sides of the gate electrode and the first upper oxide film. The conductive layer is connected to one of the impurity regions, contacting the side of one of the first side wall insulating films, having one end extending over the gate electrode with an insulating film therebetween. The second insulating film includes a second upper oxide film formed on the conductive layer, and second side wall insulating films formed on one side of the conductive layer and the second upper oxide film, with the bottom located on the surface of the other first side wall insulating film, having a portion where the film thickness becomes gradually thicker downwards.

In operation, a second side wall insulating film is formed at one side of the conductive layer and the second upper oxide film, with the bottom located on the surface of the other first side wall insulating film, having a portion where the film thickness becomes gradually thicker downwards. In the case where a conductive layer is formed over a gate electrode with a first upper oxide film therebetween, deterioration in withstanding voltage of the gate electrode and the conductive layer does not occur at the junction region of the bottom of a second side wall insulating film and the first upper oxide film.

According to another aspect of the present invention, a field effect transistor includes a semiconductor substrate, a pair of impurity regions, a gate electrode, a first insulating layer, a first conductive layer, a second insulating layer, and a second conductive layer. The pair of impurity regions is formed on the surface of the semiconductor substrate. The gate electrode is formed between the pair of impurity regions on the surface of the semiconductor substrate with a gate insulating film thereunder. The first insulating layer includes a first upper oxide film formed on the gate electrode, and a pair of first side wall insulating films formed at both sides of the gate electrode and the first upper oxide film. The first conductive layer is connected to one of the impurity regions with one side end extending over the gate electrode with an insulating film therebetween, contacting the side of one of the first side wall insulating films. The second conductive layer includes a second upper oxide film formed on the first conductive layer, and second side wall insulating films formed at one side of the first conductive layer and second upper oxide film, with the bottom located on the surface of the other of the first side wall insulating films. The second conductive layer connected to the other impurity region is formed to contact the sides of the other of the first side wall insulating films and the second side wall insulating film to be electrically insulated from the first conductive layer.

In operation, a second upper oxide film is formed on a first conductive layer; and a second side wall insulating film is formed at the side of the first conductive layer and the second upper oxide film, with the bottom located on the surface of the other of the first side wall insulating films. A second conductive layer is formed on the other impurity region, contacting the side of the other of the first side wall insulating films and the side of the second side wall insulating film to be electrically insulated from the first conductive layer. Withstanding voltage between the gate electrode and the second conductive layer is not reduced at the junction region of the bottom of the second side wall insulating film and the first upper oxide film.

According to a further aspect of the present invention, a method of manufacturing a field effect transistor comprises the step of forming an electrode layer on a semiconductor substrate. A first insulating layer is formed including a first upper oxide film covering the electrode layer and first side wall insulating films covering the sides thereof. Impurity regions are formed adjacent to the first side wall insulating films of the semiconductor substrate. A conductive layer and a second insulating film are formed on the semiconductor substrate and the first insulating layer, whereby they are patterned to have an end on the first insulating film. A third insulating film is formed all over the semiconductor substrate. The third insulating film is etched to form a second side wall insulating film contacting one side of the conductive layer located over the first insulating layer, with the bottom located on the surface of the first side wall insulating film.

In operation, a conductive layer and a second insulating layer are formed on the semiconductor substrate and the first insulating layer to be patterned to a configuration having an end on the first insulating layer. A third insulating layer is formed all over the semiconductor substrate. The third insulating layer is etched to form a second side wall insulating film contacting the side of the conductive layer positioned over the first insulating layer, with the bottom located on the surface of the first side wall insulating film. This will prevent the first upper oxide film from being removed in forming the second side wall insulating film, so that withstanding voltage is not reduced.

The foregoing and other objects, features, aspects and advantages of the present invention will become more apparent from the following detailed description of the present invention when taken in conjunction the accompanying drawings.

DESCRIPTION OF THE PREFERRED EMBODIMENTS

Figure 1A:
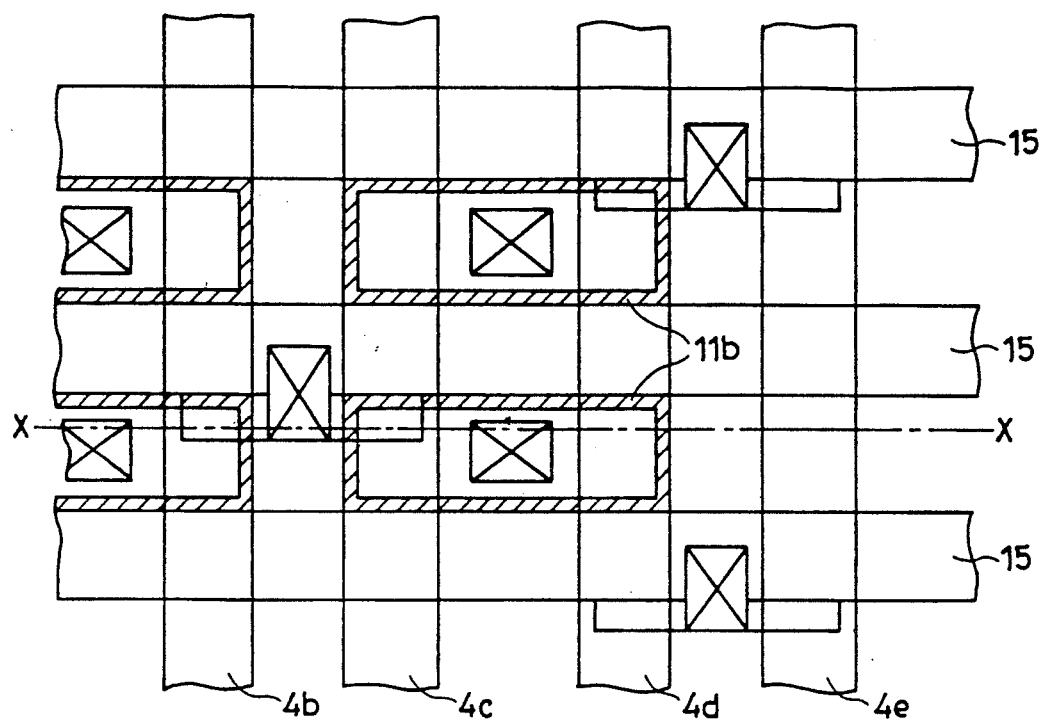
FIG. 1A is a plan layout diagram of a memory cell array of a DRAM according to an embodiment of the present invention.
Figure 1B:
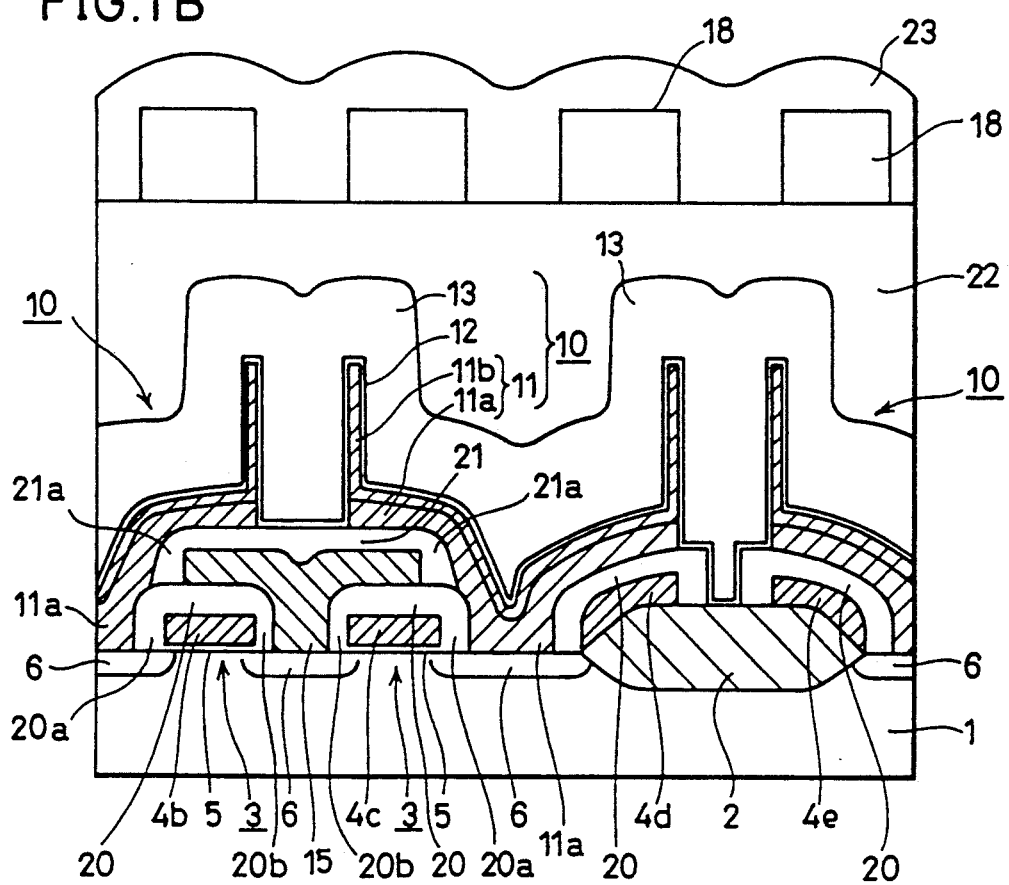
FIG. 1B is a sectional view taken along line X—X of the memory cell array of the DRAM of FIG. 1A.

Referring to FIGS. 1A and 1B, a memory cell array of a DRAM is constituted by a transfer gate transistor 3 and a capacitor 10. Transfer gate transistor 3 comprises one pair of source/drain regions 6 formed on the surface of a P type silicon substrate 1, and gate electrodes 4b and 4c formed on the surface of P type silicon substrate 1 with a gate insulating film 5 thereunder between one pair of source/drain regions 6. Gate electrodes 4b and 4c are covered with insulating oxide film 20 and side walls 20a and 20b. Side wall 20a is formed thicker than side wall 20b. Capacitor 10 is formed of a layered structure of a lower electrode (storage node) 11, a dielectric layer 12, and an upper electrode (cell plate) 13. Lower electrode 11 is constituted by a base portion 11a connected to source/drain regions 6 formed adjacent to field oxide film 2, and a wall 11b formed to expand in a vertical direction along the outer periphery of base portion 11a. Wall 11b of lower electrode 11 is effective for ensuring constant capacitance when miniaturized, due to both the inside and the outside thereof implementing the capacitance. A bit line 15 is connected to one of source/drain regions 6 of transfer gate transistor 3. Gate electrodes 4d and 4e are formed on a field oxide film 2. An insulating oxide film 20 is formed to cover gate electrodes 4d and 4e. Gate electrodes 4b, 4c, 4d and 4e are arranged longitudinally with predetermined distances, as shown in FIG. 1A. The bit lines 15 are arranged laterally with a predetermined distance. An interlayer insulating film 22 is formed on an upper electrode 13. Interconnection layers 18 are, formed over interlayer insulating film 22 at positions corresponding to gate electrodes 4b, 4c, 4d and 4e, respectively. A protect film 23 is formed to cover interconnection layer 18. The feature of the present embodiment lies in the position where side wall 21a formed at the side wall of bit line 15 contacts side wall 20a formed at the side wall of gate electrodes 4b and 4c. The present embodiment is implemented so that the bottom of side wall 21a formed at the side of bit line 15 contacts side wall 20a of gate electrodes 4b and 4c. Insulating oxide film 20 on gate electrodes 4b and 4c is not reduced in thickness, as in conventional semiconductor devices. Therefore, withstanding voltage between base portion 11a and gate electrodes 4b and 4c can be improved.

Figure 2A:
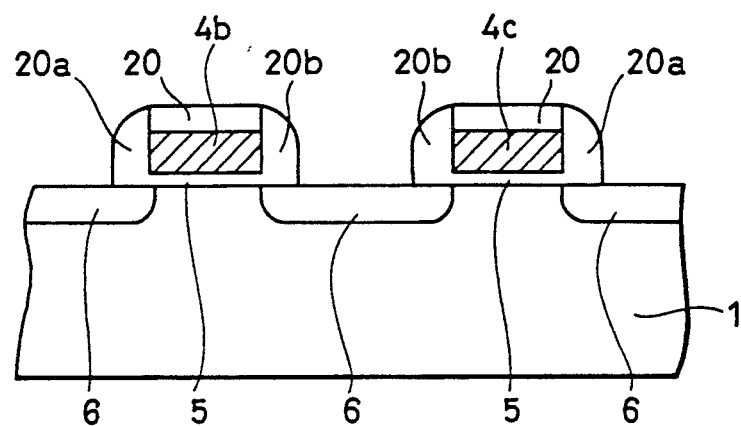
FIGS. 2A–2D are sectional views of the memory cell of FIG. 1 for describing the manufacturing process.
Figure 2B:
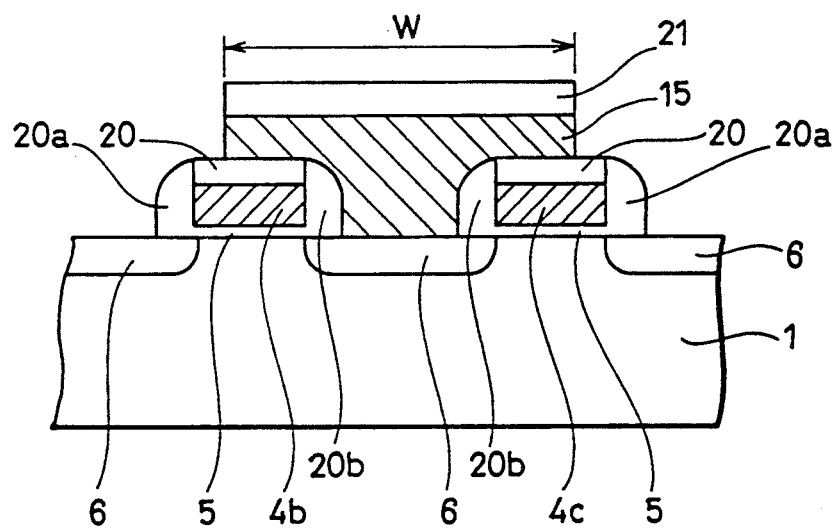
Figure 2C:
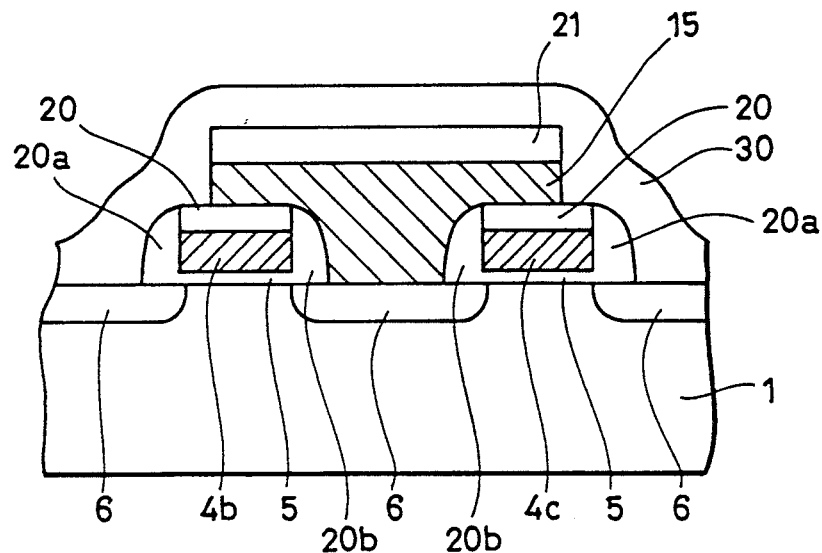
Figure 2D:
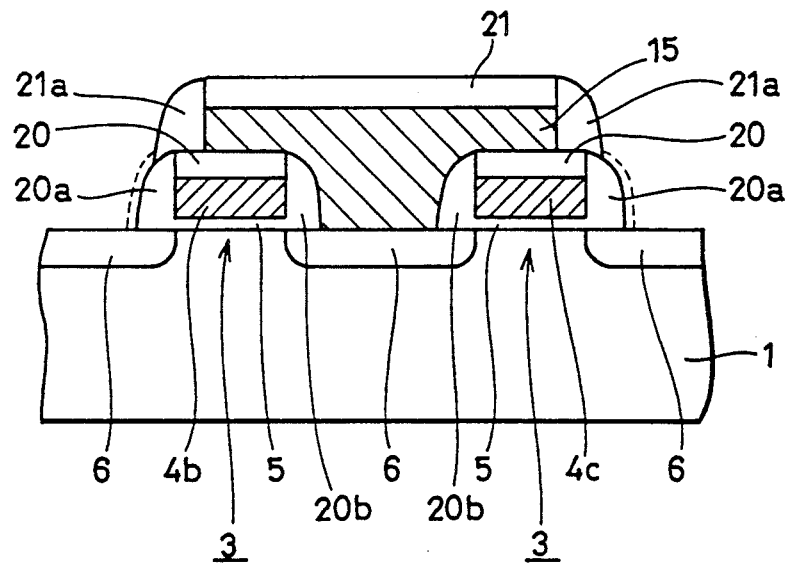
Figure 6:
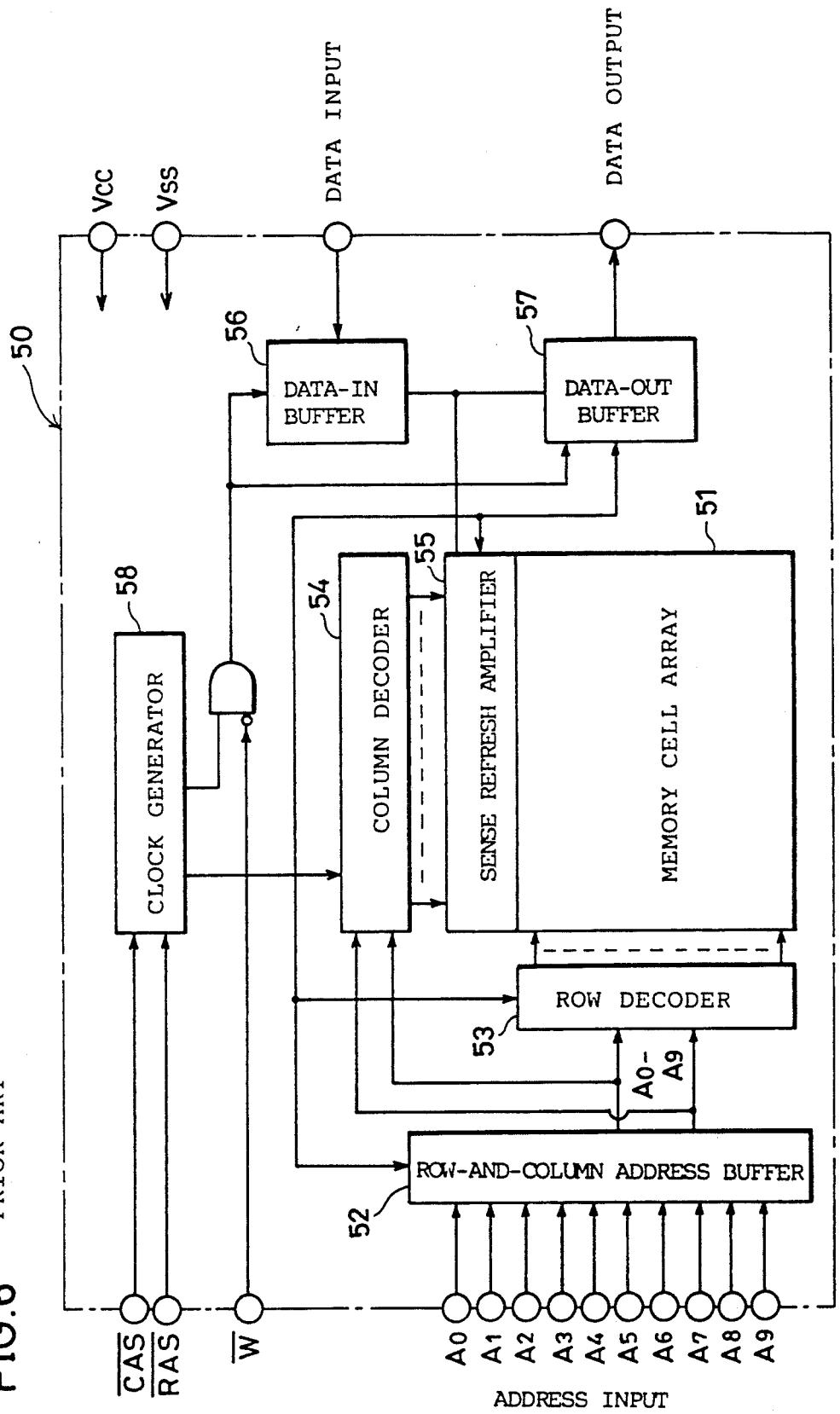
FIG. 6 is a circuit block diagram showing the structure of a conventional DRAM.
Figure 7:
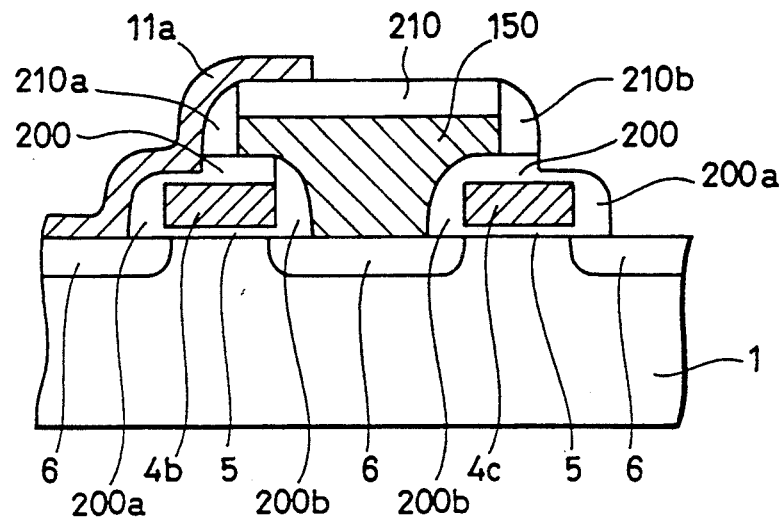
FIG. 7 is a sectional view showing a memory cell of a conventional DRAM.
Figure 8A:
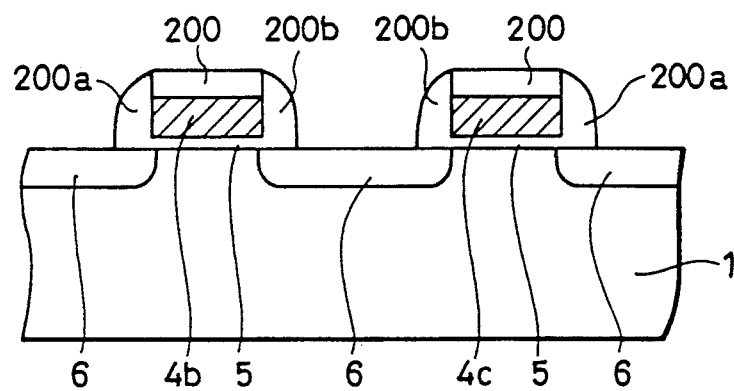
FIGS. 8A–8D are sectional views of the memory cell of the DRAM of FIG. 7 for describing the manufacturing process.
Figure 8B:
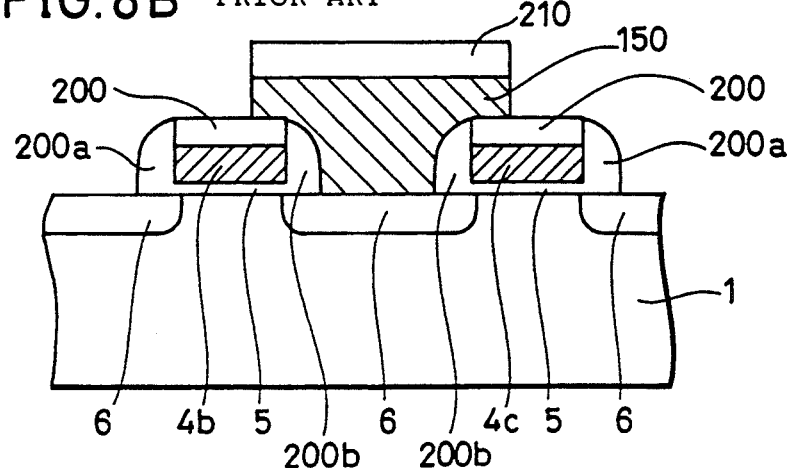
Figure 8C:
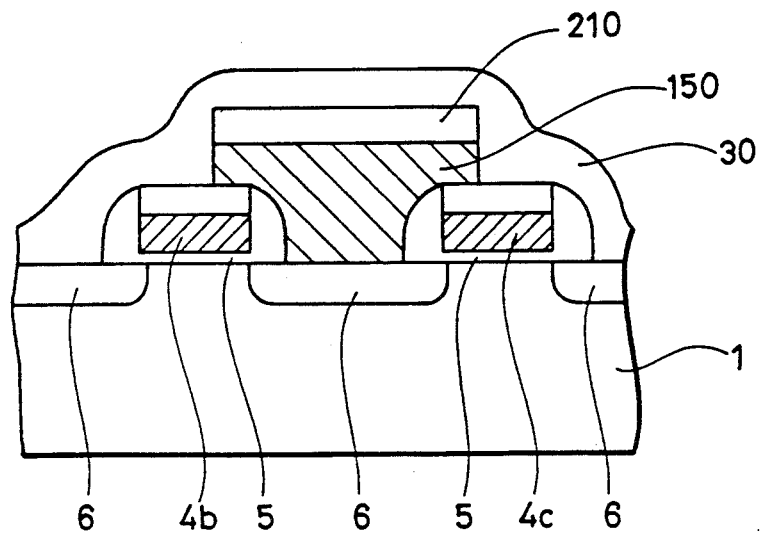
Figure 8D:
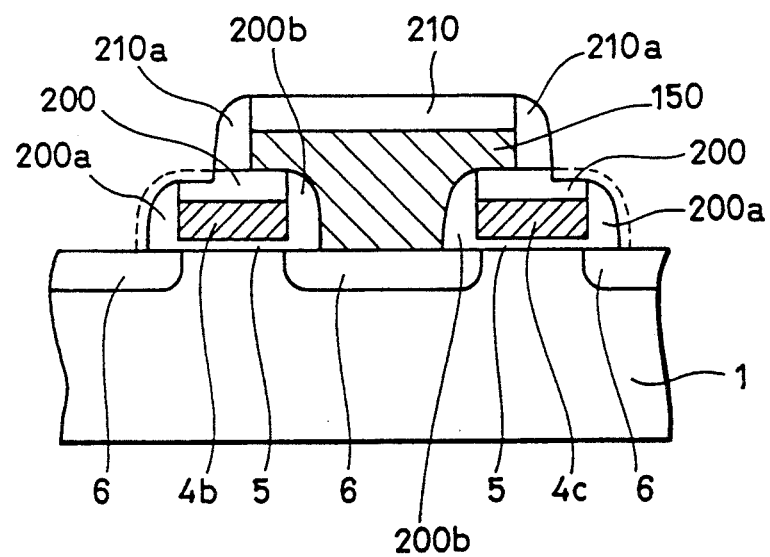

The manufacturing process will be described with reference to FIGS. 1–2D. Referring to FIG. 2A, gate electrodes 4b and 4c are formed with a predetermined distance on P type silicon substrate 1 with gate insulating film 5 thereunder. Insulating oxide film 20 is formed to cover gate electrodes 4b and 4c. Then, source/drain regions 6 are formed. Side walls 20a and 20b are formed to cover the sides of gate electrodes 4b and 4c, and insulating oxide film 20. Referring to FIG. 2B, bit line 15 is formed on source/drain regions 6 between gate electrodes 4b and 4c. Insulating oxide film 21 is formed on bit line 15. The width W of bit line 15 is formed to be wider than that of a conventional bit line (refer to FIG. 6) in the present embodiment. Referring to FIG. 2C, oxide film 30 is formed all over the surface. Referring to FIG. 2D, oxide film 30 is etched anisotropically to form side walls 21a. Side wall 21a is formed so that the bottom contacts side walls 20a of gate electrodes 4b and 4c. Even in the case where base portion 11a is formed on source/drain regions 6 to contact side walls 20a and 21a, as shown in FIG. 1, the characteristic of withstanding voltage can be improved without reduction of film thickness of the insulating layer interposed between base portion 11a and gate electrodes 4b and 4c. Occurrence of field concentration resulting from insulating oxide film 20 being over-etched to form an edge is eliminated.

Figure 3:
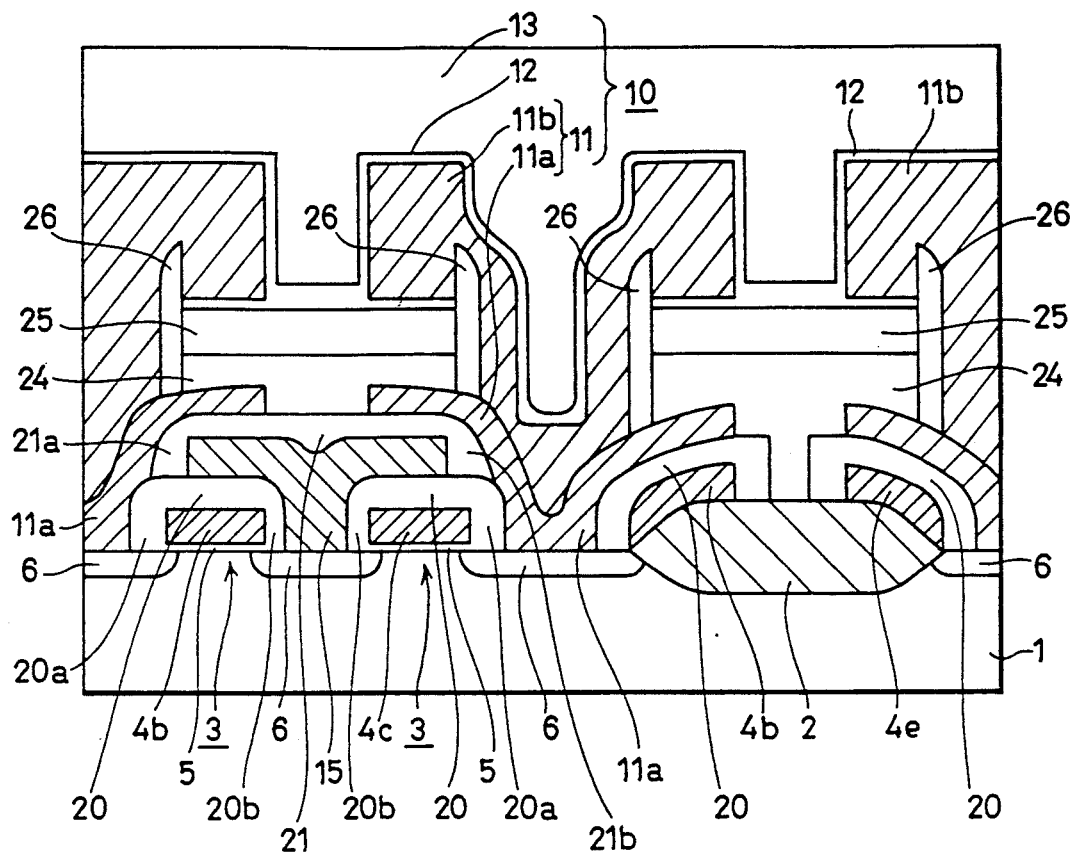
FIG. 3 is a sectional view of a memory cell array of a DRAM according to another embodiment of the present invention.

A second embodiment of FIG. 3 differs in capacitor structure from the first embodiment of FIG. 1. Capacitor 10 of the second embodiment is constituted by lower electrode 11 formed of base portion 11a connected to source/drain regions 6 and wall 11b formed in a region sandwiched by insulating films 26, dielectric layer 12 formed to cover low electrode 11, and upper electrode 13 formed on dielectric layer 12. An oxide film 24 is formed on insulating oxide film 21 above bit line 15, and field oxide film 2. An insulating layer 25 is formed on oxide film 24. Bit line 15 is formed to have a large width, similarly as in the first embodiment of FIG. 1, with side walls 21a formed at the sides. The bottom of side wall 21a is formed to contact the surface of side wall 20a of gate electrodes 4b and 4c. This structure will give an effect similar to that of the first embodiment of FIG. 1. In other words, the characteristic of withstanding voltage can be improved between base portion 11a forming lower electrode 11 of the capacitor and gate electrodes 4b and 4c.

Figure 4:
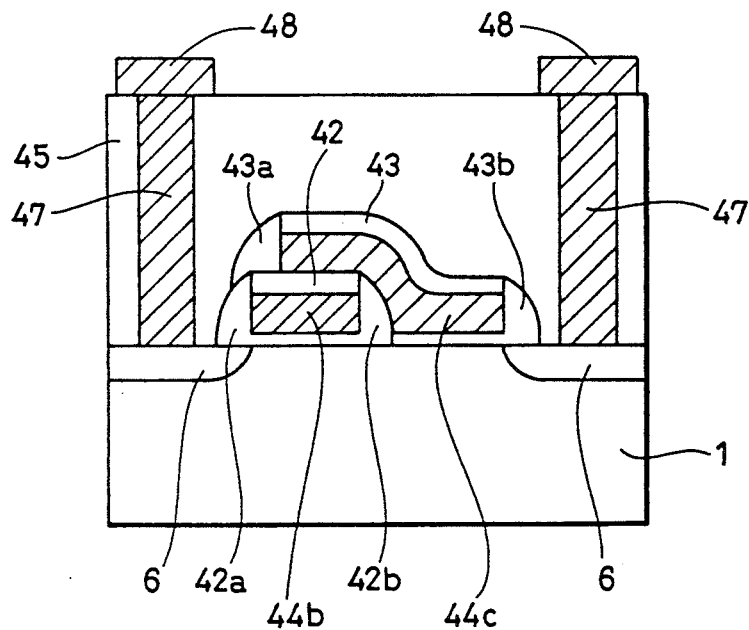
FIG. 4 is a sectional view of a 2-gate FET according to a further embodiment of the present invention.

Referring to FIG. 4, a 2-gate FET has a pair of source/drain regions 6 formed on P type silicon substrate 1. An interconnection layer 48 is formed above source/drain regions 6 with a contact layer 47 therebetween. Two gate electrodes 44b and 44c are formed between one pair of source/drain regions 6. Gate electrode 44c extends over gate electrode 44b with insulating oxide film 42 and side wall 42b therebetween. Insulating oxide film 43 is formed on gate electrode 44c. Side walls 43a and 43b are formed at the sides thereof. Interlayer insulating film 45 is formed to cover the whole surface. The feature of the present invention lies in that one side of the bottom of side wall 43a of gate electrode 44c contacts smoothly with the upper surface of side wall 42a of gate electrode 44b. Coverage of interlayer insulating film 45 at the contact region of side wall 42a and side wall 43a is not deteriorated, in forming interlayer insulating film 45 over side walls 42a and 43a. Reduction in reliability of the two-gate transistor can be prevented effectively.

Figure 5:
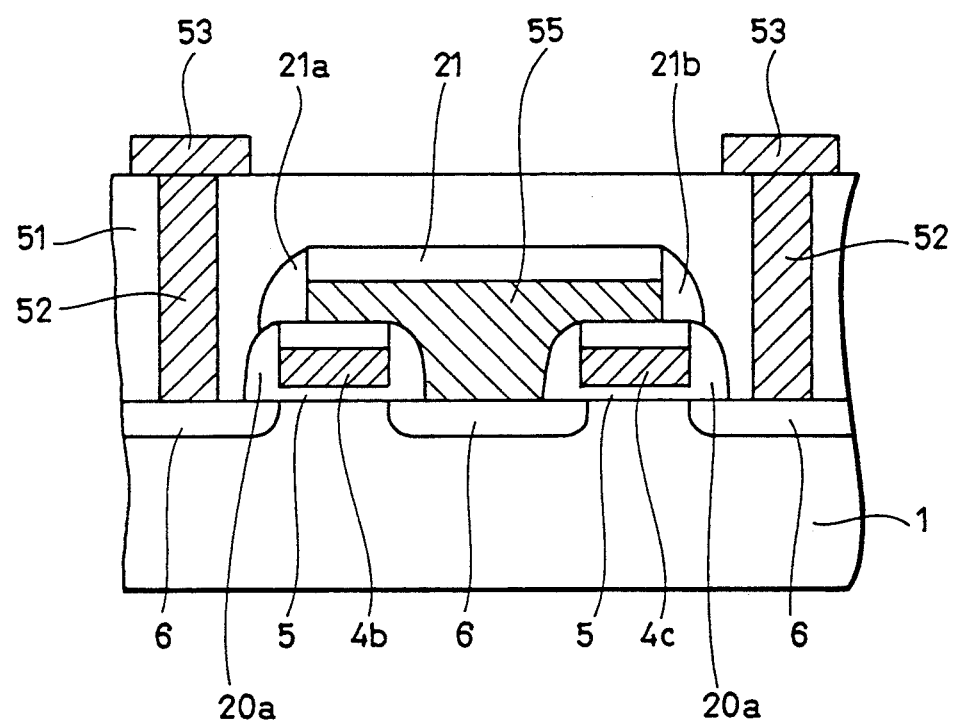
FIG. 5 is a sectional view of a parallel transistor according to a still further embodiment of the present invention.

Referring to FIG. 5, a parallel transistor has source/drain regions 6 with a predetermined distance formed on P type silicon substrate 1. Gate electrodes 4b and 4c are formed between source/drain regions 6 with gate insulating film 5 thereunder. An interconnection layer 55 is formed on the source/drain region 6 sandwiched between gate electrodes 4b and 4c. Insulating oxide film 21 and side walls 21a and 21b are formed over interconnection layer 55. Interconnection layer 53 is formed over source/drain region 6 with a contact layer 52 therebetween. Substrate 1 is covered with interlayer insulating film 51 except where contact layer 52 is formed. The feature of the fourth embodiment lies in that the contact of one end of the bottom of the side wall 21a formed on both sides of interconnection layer 55 and the insulating layer covering gate electrodes 4b and 4c is located on the surface of side wall 20a. This gives an effect similar to that of the third embodiment. In other words, coverage of interlayer insulating film 51 between the junction region of side walls 20a and 21a is not deteriorated in forming interlayer insulating film 51 on side walls 20a and 21a. Therefore, reduction in reliability of the parallel transistor can be prevented effectively.

As described in the above embodiments, the side wall structure of the present invention can be applied to various semiconductor devices. Although the manufacturing process of the first embodiment of FIG. 1 was shown in FIGS. 2A-2D, the manufacturing process of the present invention is not limited to this. For example, a similar configuration can be obtained by bit line 15 having a width similar to that of a conventional one and by increasing the thickness of oxide film 30 in forming side walls 21a at the sides of bit line 15 to increase the thickness of side walls 21a. A side wall 21a similar to that shown in FIG. 1 can be formed by employing both the methods of increasing the width of bit line 15 and the thickness of oxide film 30 at the time of forming side walls 21a.

In accordance with a concept of a field effect transistor of the present invention, a first insulating layer is formed having a first upper oxide film on a gate electrode, and a pair of first side wall insulating films on both sides of the gate electrode and the first upper oxide film. A conductive layer is formed at one of the impurity regions formed on the surface of the semiconductor substrate, contacting one side of one of the first side wall insulating films, with one end extending over the gate electrode with an insulating film therebetween. A second insulating layer is formed having a second upper oxide film on the conductive layer and a second side wall insulating film with the bottom end of the conductive layer and second upper oxide film located on the surface of the other of the first side wall insulating films. In the case a conductive layer is formed on the electrode layer with a first upper oxide film therebetween, withstanding voltage of the electrode layer and the conductive layer is not reduced in the junction region of the bottom of the second side wall insulating film and the first upper oxide film. Therefore, a field effect transistor is provided that allows improvement of withstanding voltage between multilayer interconnection layers even when scaled to higher integration.

In accordance with another aspect of a field effect transistor of the present invention, a first insulating film is formed having a first upper oxide film on a gate electrode, and a pair of first side wall insulating films on both sides of the gate electrode and the first upper oxide film. A first conductive layer is formed at one of the pair of impurity regions formed on the surface of the semiconductor substrate, connected to the side of one of the first side wall insulating films, with one end extending over the gate electrode with an insulating film therebetween. A second insulating layer is formed having a second upper oxide film on the first conductive layer and a second side wall insulating film with the bottom of one side of the first conductive layer and the second upper oxide film located on the surface of the other of the first side wall insulating films. A second conductive layer is formed at the other of the impurity regions, contacting the side of the other of the first side wall insulating films and the side of second side wall insulating film to be electrically insulated from the first conductive layer. This gives the advantage that withstanding voltage of the electrode layer and the conductive layer is not reduced in the junction region of the bottom end of the second side wall insulating film and the first upper oxide film. Therefore, a field effect transistor is provided that allows the improvement of withstanding voltage between multilayer interconnection layers even when scaled to a higher density.

In accordance with a further concept of the present invention, a method of manufacturing a field effect transistor comprises the step of forming an electrode layer on a semiconductor substrate. A first insulating film is formed constituted by a first upper oxide film covering the electrode layer and a first side wall insulating film covering the side. An impurity region is formed at a region adjacent to the first side wall insulating film of the semiconductor device. A conductive layer and a second insulating layer is formed on the semiconductor substrate and the first insulating layer to be patterned to have the side over the first insulating layer. A third insulating film is formed all over the semiconductor substrate. The third insulating layer is etched to form a second side wall insulating film contacting the side of the conductive layer located over the first insulating layer, with the bottom side thereof located on the surface of the first side wall insulating film. This gives the advantage that the first upper oxide film is not removed in forming a second side wall insulating film so that withstanding voltage is not reduced. Therefore, a method of manufacturing a field effect transistor is provided that allows improvement of withstanding voltage between multilayer interconnection layers even when integrated to higher density.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor comprising:
   a semiconductor substrate (1),
   a pair of impurity regions (6) formed on the surface of said semiconductor substrate,
   a gate electrode (4c) located between said pair of impurity regions, and formed on the surface of said semiconductor substrate with a gate insulating film thereunder,
   a first insulating layer (20, 20a, 20b) having a first upper oxide film (20) formed on said gate electrode, and a pair of first side wall insulating films (20a, 20b) formed on both sides of said gate electrode and said first upper oxide film, a conductive layer (15) connected to one of said impurity regions, contacting the side of one of said first side wall insulating films, with one side end extending over said gate electrode with said first upper oxide film therebetween, and a second insulating layer (21, 21a) having a second upper oxide film (21) formed on said conductive layer, and side of said conductive layer and said second upper oxide film, with the bottom side end located on the surface of the other of said first side wall insulating films, having a portion where film thickness becomes gradually thicker downwards.

2. The field effect transistor according to claim 1, wherein said second side wall insulating film (21a) is formed so that the bottom side end is located outside the side wall of said gate electrode (4b, 4c).

3. The field effect transistor according to claim 1, wherein said other of first side wall insulating films (20a) is formed thicker than said one of said first side wall insulating films (20b).

4. The field effect transistor according to claim 2, wherein said other of said first side wall insulating films (20a) is formed thicker than said one of said first side wall insulating films (20b).

5. A field effect transistor comprising:
a semiconductor substrate (1),
a pair of impurity regions (5) formed on the surface of said semiconductor substrate,
a gate electrode (4c) located between said pair of impurity regions, and formed on the surface of said semiconductor substrate with a gate insulating film thereunder,
a first insulating layer (20a, 20b) having a first upper oxide film (20) formed on, said gate electrode, and a pair of first side wall insulating films formed on both sides of said gate electrode and said first upper oxide film,
a first conductive layer (15) connected to said one of impurity regions, contacting the side of said one of said first side wall insulating film, with one side end extending over said gate electrode with said first upper oxide film therebetween,
a second insulating layer (21, 21a) having a second upper oxide film (21) formed on said first conductive layer, and a second side wall insulating layer (21a) formed on one side of said first conductive layer and said second upper oxide film, with the bottom side end located on the surface of said other of said first side wall insulating film, and
a second conductive layer (11a) connected to said other of impurity regions, contacting the side of said other of said first side wall insulating films and the side of said second side wall insulating film to be electrically insulated from said first conductive layer.

6. The field effect transistor according to claim 5, wherein said second side wall insulating film (20a) comprises a portion where the film thickness thereof gradually increases downwards.

7. The field effect transistor according to claim 6, wherein said second side wall insulating film (21a) is formed so that the bottom side end is positioned outside the side wall of said gate electrode (4b, 4c).

8. The field effect transistor according to claim 6, wherein said other of said first side wall insulating films (20a) is formed thicker than said one of said first side wall insulating films (20b).

9. The field effect transistor according to claim 7, wherein said other of said first side wall insulating films (20a) is formed thicker than said one of said first side wall insulating films (20b).

10. The field effect transistor according to claim 5, wherein
said first conductive layer comprises a bit line (15), and
said second conductive layer comprises a low electrode (11) of a capacitor.

11. The field effect transistor according to claim 10, wherein said low electrode (11) of the capacitor is formed so that the end extends in a direction perpendicular to said semiconductor substrate.

12. A field effect transistor comprising:
a semiconductor substrate (1),
a pair of impurity regions (6) formed on the surface of said semiconductor substrate,
a first gate electrode (44b) adjacent to said one of impurity regions, formed with a predetermined width on the surface of said semiconductor substrate with a first gate oxide film thereunder,
a first insulating layer having a first upper oxide film (42) formed on said first gate electrode, and a pair of first side wall insulating films (42a, 42b) formed on both sides of said first gate electrode and said first upper oxide film,
a second gate electrode (44c) adjacent to said other of impurity regions, contacting the side of said one of first side wall insulating films, with a predetermined width on the surface of said semiconductor substrate with a second gate oxide film thereunder, wherein one side end extends over said first gate electrode with said first upper oxide film therebetween, and
a second insulating layer (21, 21a) having a second upper oxide film (21) formed on said second gate electrode, and a second side wall insulating film (21a) formed on one side of said second gate electrode and said second upper oxide film, with the bottom side end located on the surface of said other of first side wall insulating films, having a portion where film thickness becomes gradually thicker downwards.

13. The field effect transistor according to claim 12, wherein said field effect transistor comprises a two-gate transistor.

14. The field effect transistor according to claim 1, wherein said field effect transistor comprises a parallel transistor.

15. A field effect transistor comprising:
a semiconductor substrate,
a transfer gate transistor having a pair of source/drain regions formed on the surface of said semiconductor substrate, and a gate electrode formed between said pair of source/drain regions with a gate oxide film thereunder,
a bit line connected to said one of impurity regions, formed at the side wall and over said gate electrode with a first insulating film therebetween,
a second insulating film formed on said bit line, and
a low electrode of a capacitor connected to said other of impurity regions, formed at the side walls of said gate electrode and said bitline with said fist insulating film and said second insulating film therebetween, respectively,
wherein said side wall of said second insulating film comprises a portion where the film thickness thereof gradually increases downwards, and
wherein said first insulating film and said second insulating film are formed to join smoothly at the junction region thereof.

* * * * *